United States Patent [19]

Buelow et al.

[11] 3,808,475

[45] Apr. 30, 1974

[54] LSI CHIP CONSTRUCTION AND METHOD

[75] Inventors: Fred K. Buelow, Los Altos; John J. Zasio, Sunnyvale, both of Calif.

[73] Assignee: Amdahl Corporation, Sunnyvale, Calif.

[22] Filed: July 10, 1972

[21] Appl. No.: 270,449

[52] U.S. Cl....... 317/235 R, 317/235 D, 317/235 E, 317/234 N

[51] Int. Cl............................................. H01l 19/00

[58] Field of Search...................................... 317/235

[56] References Cited

UNITED STATES PATENTS

| | | | |
|---|---|---|---|
| 3,656,028 | 4/1972 | Langdon | 317/235 |
| 3,707,036 | 12/1972 | Okabe et al. | 29/574 |
| 3,689,803 | 9/1972 | Baker et al. | 317/101 |
| 3,584,269 | 6/1971 | Thun | 317/235 |
| 3,639,814 | 2/1972 | Engbert | 317/235 |

*Primary Examiner*—Rudolph V. Rolinec
*Assistant Examiner*—E. Wojciechowicz
*Attorney, Agent, or Firm*—Flehr, Hohbach, Test, Albritton & Herbert

[57] ABSTRACT

LSI chip construction having a semiconductor body with a plurality of transistors formed in the semiconductor body in a predetermined pattern and a plurality of resistors formed in a semiconductor body in a predetermined pattern. Means is provided which includes two layers of metallization having input and output pads adjacent the outer perimeter of the body and contacting said transistors and resistors to form a plurality of emitter-follower circuits with certain of the emitter-follower circuits being made up of larger transistors and being located near the perimeter of the chip and near the input-output pads. The other emitter coupled circuits are clustered in groups to form an array of such groups with each of the groups being capable of containing a plurality of logic circuits.

29 Claims, 33 Drawing Figures

LSI CHIP CONSTRUCTION AND METHOD

SUMMARY OF THE INVENTION AND OBJECTS

The LSI chip construction consists of a semiconductor body which has a planar surface. A plurality of transistors are formed in the semiconductor body having regions which extend to the surface. The transistors are formed in a predetermined pattern. A plurality of resistors are formed in the semiconductor body in a predetermined pattern and also have contact areas extending to the surface. Means is provided on the surface and includes two layers of metallization having input and output pads adjacent the perimeter of the body contacting the transistors and resistors to form a plurality of emitter-follower circuits with certain of the emitter-follower circuits being made of larger transistors and being located near the perimeter of the chip and near the input and output pads. The other emitter coupled circuits are clustered in groups to form an array of such groups with each of the groups being capable of containing a plurality of logic circuits.

In general, it is an object of the present invention to provide an LSI chip construction and method which makes it possible to obtain very high performance.

Another object of the invention is to provide a chip construction and method of the above character in which the time delay in the circuits in the chip construction is better than two nanoseconds.

Another object of the invention is to provide a chip construction and method in which a plurality of transistors and a plurality of resistors are formed in the chip and are arranged in patterns in such a way that a large number of emitter-follower circuits can be formed.

Another object of the invention is to provide an LSI chip construction and method of the above character in which two-layer metallization is utilized for forming interconnections.

Another object of the invention is to provide a chip construction and method of the above character in which the emitter-follower circuits are arranged in groups and the groups are formed into an array.

Another object of the invention is to provide an LSI chip construction and method of the above character in which each group is capable of forming a plurality of logic circuits.

Another object of the invention is to provide an LSI chip construction and method in which many common masks can be utilized.

Another object of the invention is to provide a chip construction and method of the above character in which a common diffusion pattern is utilized for all the chips.

Another object of the invention is to provide an LSI chip construction and method which utilizes transistors having washed emitters with relatively small geometries so that very fast devices are provided.

Another object of the invention is to provide an LSI chip construction and method in which the resistors and small transistors are formed in groups called "macros."

Another object of the invention is to provide an LSI chip construction and method in which the resistors in each macro are positioned with one end of each of the resistors near the outer perimeter of the macro in an area which might otherwise be wasted space.

Another object of the invention is to provide a chip construction and method of the above character in which the resistors are placed so that one end of each of the resistors is near the center of the macro region where all the interconnections of the macro are accomplished and the other end of the resistor is placed near the periphery of the macro where the power supply line for the macro runs so that the need for additional wiring is eliminated.

Another object of the invention is to provide a chip construction and method of the above character in which the resistors are laid out symmetrically around a centerline through the macro so that the macro can be reversed by flipping from one orientation to the other to simplify the interconnection between macros.

Another object of the invention is to provide a chip construction and method of the above character in which certain resistors in the macro are merged into the base region of certain transistors to form common devices.

Another object of the chip construction and method is to provide large emitter-follower transistors on the periphery of the chip.

Another object of the invention is to provide a chip construction and method of the above character in which open conductor channels are provided for easy computer aided design (CAD) placement of inter-macro conductors and for "tight" placement of intra-macro conductors.

Another object of the invention is to provide a chip construction and method of the above character in which only a limited number of input-output ports are required for each macro and wherein only a limited number of positions are required for such ports.

Another object of the chip construction and method is to provide transistors which have been chosen for their speed and stability (high $r_{bb}$ and low $C_c$).

Another object of the invention is to provide a chip construction and method of the above character in which current switching circuits are utilized.

Another object of the invention is to provide a chip construction and method of the above character in which a voltage reference generating circuit is utilized in conjunction with a voltage distribution system.

Another object of the invention is to provide a chip construction and method of the above character in which there is a relatively high ratio of 3 : 1 or greater of resistance between $V_{ee}$ and the ground distribution buses.

Another object of the invention is to provide a chip construction and method of the above character in which the power bus is provided in two layers.

Another object of the invention is to provide a chip construction and method of the above character in which the voltage drop due to resistance and inductance in the conductors on the ground distribution system tracks with the voltage drop on the $V_{ee}$ voltage distribution system.

Another object of the invention is to provide a chip construction and method of the above character in which a significant built-in power supply decoupling capacitance is obtained.

Another object of the invention is to provide a chip construction and method of the above character in which the ground shift is made to track with chip temperature.

Another object of the invention is to provide a chip construction and method of the above character in which different types of chips are made by utilizing different metal patterns.

Another object of the invention is to provide a chip construction and method of the above character in which the first level metallization has conductors which all extend in one direction.

Another object of the invention is to provide a chip construction and method of the above character in which the second level metallization has conductors running at right angles to the conductors on the first layer of metallization.

Additional objects and features of the invention will appear from the following description in which the preferred embodiments are set forth in detail in conjunction with the accompanying drawing.

BRIEF DESCRIPTION OF PREFERRED EMBODIMENTS

Figures 1, 2:
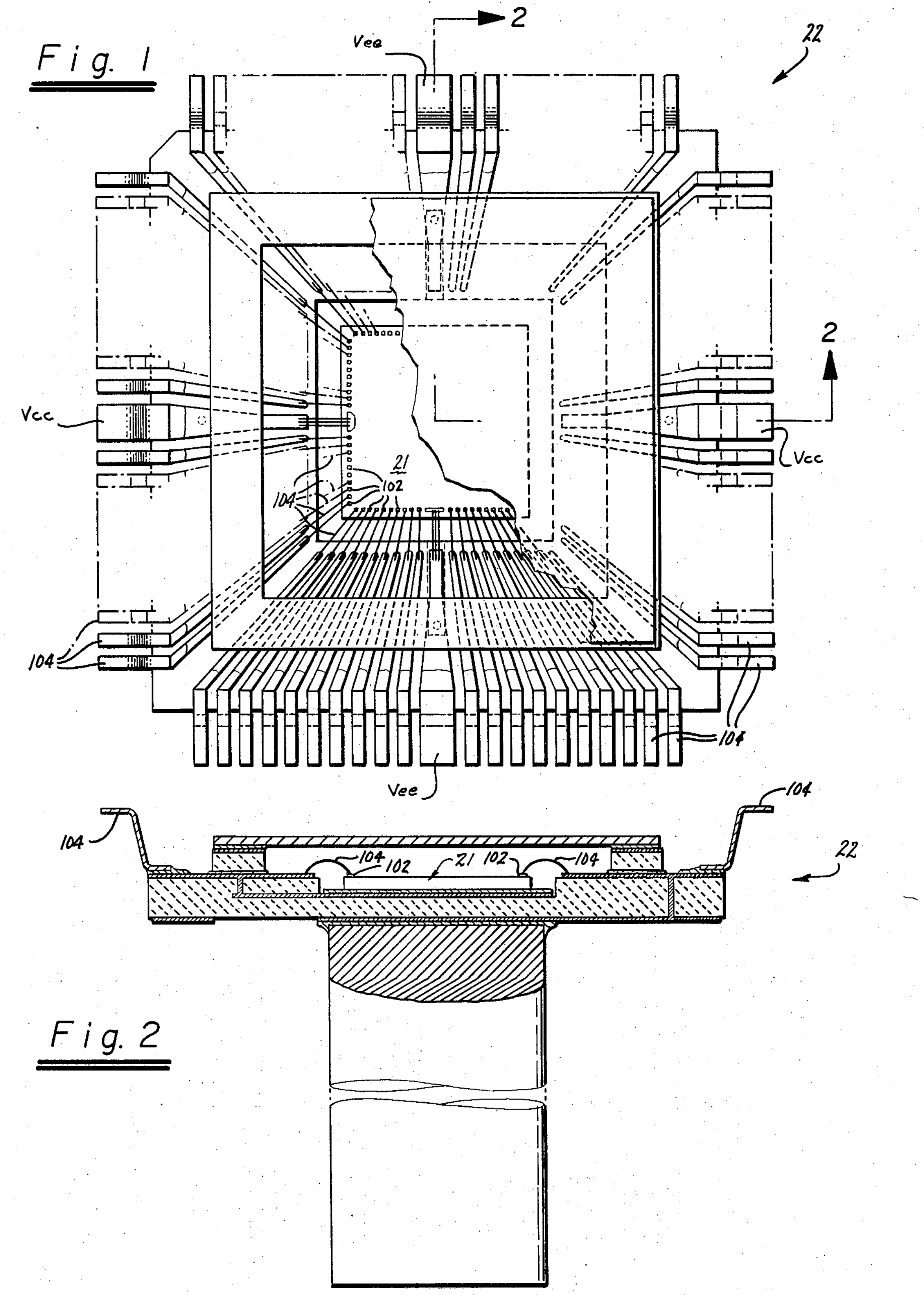
FIG. 1 is a top plan view of an LSI chip construction incorporating the present invention and showing the same mounted in a package.
FIG. 2 is a cross-sectional view taken along the line 2—2 of FIG. 1.

An LSI chip 21 incorporating the present invention is shown in FIGS. 1 and 2 and is mounted within a package 22 of the type described in copending application Ser. No. 270,448, filed July 10, 1972.

Figure 3A:
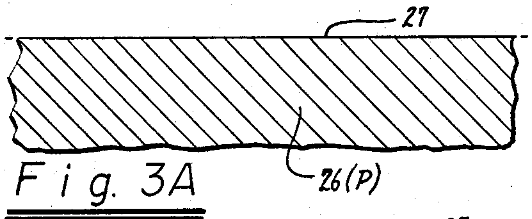
FIGS. 3A—3L are cross-sectional views showing the method utilized for fabricating the LSI chip.
Figure 3B:
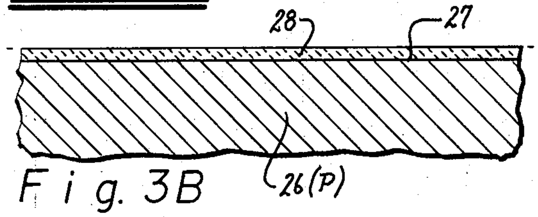

In fabricating the LSI chip, wafers of a suitable size such as 2½ inches in diameter and 20 mils thickness, are utilized to provide a semiconductor body 26. The semiconductor body 26 is formed of silicon and has an impurity of one conductivity type, P-type, uniformly distributed therein. The semiconductor body 26 is provided with a planar surface 27 shown in FIG. 3A. An insulating layer 28 formed of a suitable material such as silicon dioxide is formed on the surface 27 to serve as a diffusion mask. Windows or openings 29 are formed in the insulating layer 28 by utilization of conventional photolithographic techniques in connection with the mask shown in FIG. 4A. The size of the openings or windows 29 is determined by the size of the dark areas 31 in the mask shown in FIG. 4A. As can be seen from FIG. 4A, the windows 31 are of various sizes and are arranged in a predetermined pattern. The pattern shown in FIG. 4A corresponds to the pattern for one macro of a plurality of 25 such macros provided for each chip with each wafer providing a hundred or more LSI chips.

Figure 3C:
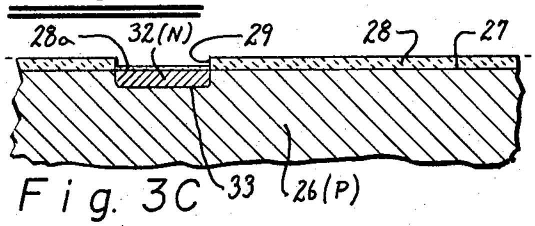

After the openings or windows 29 have been formed, a suitable N-type impurity is diffused through the openings 29 to form N-type regions 32 which are defined in cross-section by dish-shaped PN junctions 33 which extend to the surface 27 beneath the insulating layer 28. At the time that the diffused region 32 is being formed, a relatively thin layer 28a of silicon dioxide is formed in the windows 29 as shown in FIG. 3C.

Figure 3D:
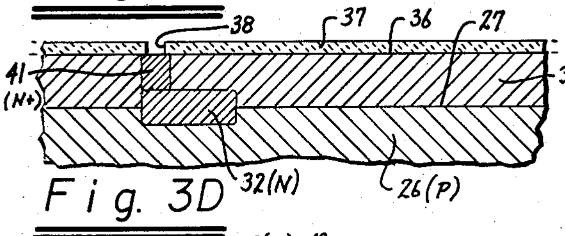

After the diffused regions 32 have been formed, the silicon dioxide layer 28 is stripped from the surface 27 with a suitable etch. An epitaxial layer 34 with an N-type impurity is then formed on the surface to a suitable thickness as, for example, 0.1 of a mil. The epitaxial layer 34 has a planar surface 36. During the time that the epitaxial layer 34 is being formed, the regions 32 which are to form buried layers will out-diffuse upwardly into the epitaxial layer 34 as shown in FIG. 3D.

Figure 3E:
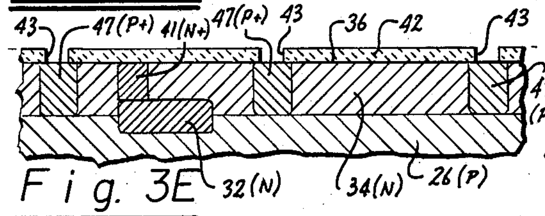
Figures 4A, 4B, 4C, 4D, 4E, 4F, 4G, 4H, 4I, 4J:
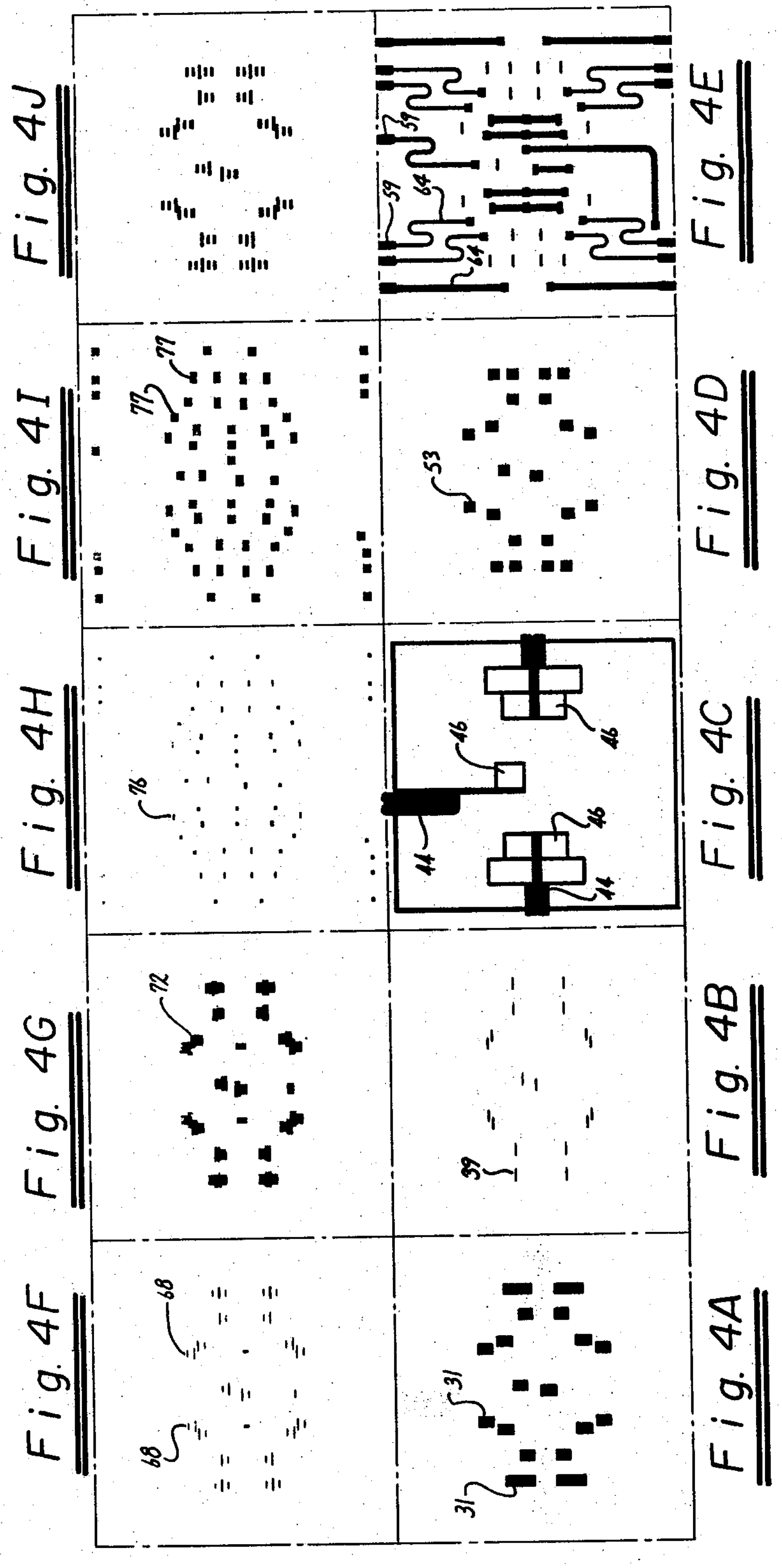
FIGS. 4A—4J are plan views of the diffusion mask utilized in the steps shown in FIGS. 3A—3L.
Figure 5:
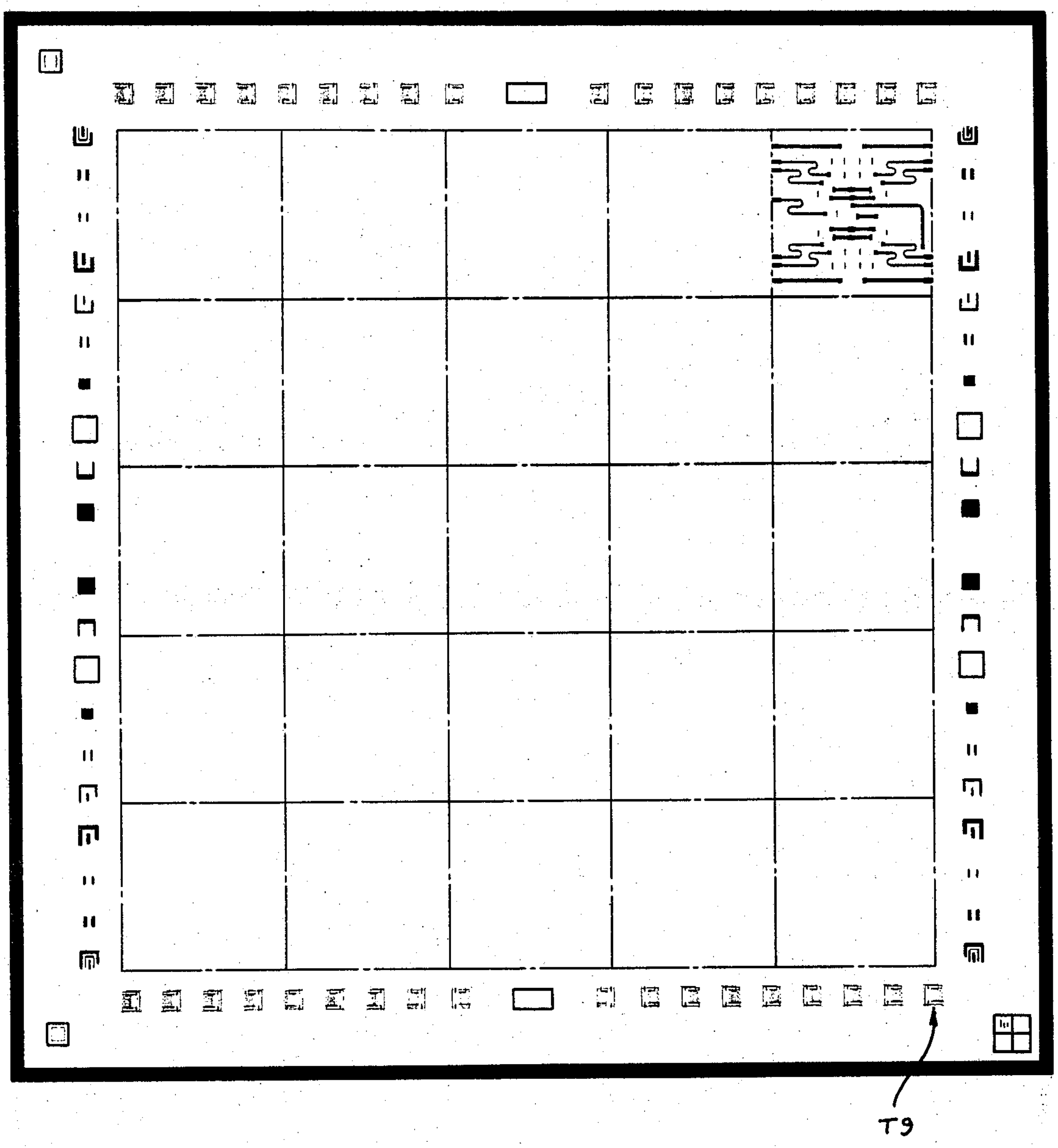
FIG. 5 is a plan view of the LSI chip with the pattern provided by FIG. 4E being formed in one of the macros of the chip.

After the epitaxial layer 34 has been grown, a layer 37 of silicon dioxide is grown on the surface 36 and then by utilization of conventional photolithographic techniques and the mask shown in FIG. 4B, openings or windows 38 are formed in the silicon dioxide layer 37. The size of the openings 38 corresponds to the size of the dark areas 39 in the mask as shown in FIG. 4B. A suitable N-type impurity is then diffused through the openings or windows 38 in a deep diffusion process to form N+ regions 41 which extend downwardly and make contact with the N-type buried layer and the N-type collector region 32, as shown in FIG. 3D. After this deep collector diffusion has been carried out, the silicon dioxide layer 36 can be removed by a suitable etch and thereafter another layer of silicon dioxide 42 grown on the surface 36 as shown in FIG. 3E. Windows 43 are then formed in the silicon dioxide layer 42 by conventional photolithographic techniques utilizing the mask shown in FIG. 4C. The openings or windows 43 which are formed in the silicon dioxide layer 42 correspond to the dark areas 44 which are provided in the mask shown in FIG. 4C. The dark areas 44 also define a plurality of pockets 46 which, as shown in FIG. 4C, provide four pockets on the left, four pockets on the right and one pocket in the center which form isolation regions (see FIG. 3E) in the semiconductor body in which transistors can be formed as hereinafter described.

A P-type impurity is diffused through the openings 43 and is diffused downwardly to provide P+ regions 47 which are diffused downwardly sufficiently far so that they meet the P-type semiconductor body 26 to thereby provide regions of N-type semiconductor material in the epitaxial layer 34 which are utilized for the formation of devices in the LSI chip as hereinafter described. The large dark areas adjacent the pockets 46 correspond to areas in which the P-type impurity is diffused to provide regions which are highly conductive to minimize as much as possible any voltage drops in the region in case of any current flow through the isolation region. By keeping this voltage drop very low, it prevents active devices being formed out of the isolation region.

It should be appreciated that the isolation step provided for in the mask shown in FIG. 4C can precede the formation of the deep collector by the use of the mask shown in FIG. 4B if desired. Both steps involve deep diffusions and, therefore, the heating required for the diffusion step does not deleteriously affect the other deep diffused regions which have been formed.

Figure 3F:
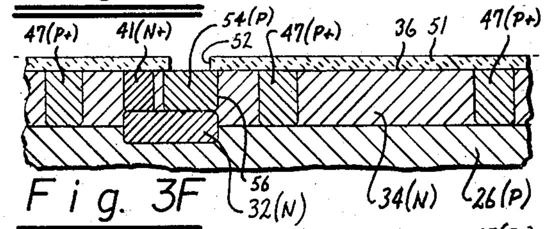
Figure 3G:
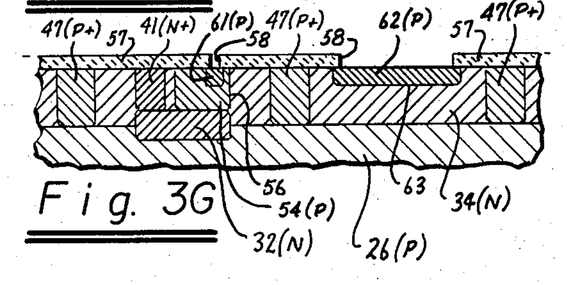
Figure 3H:
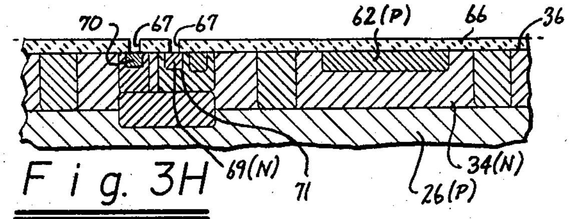
Figure 3I:
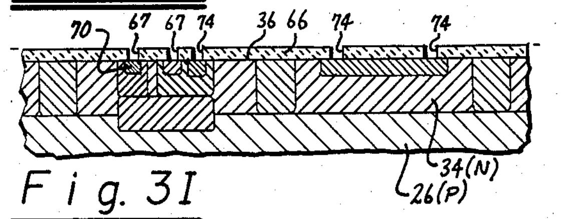

The silicon dioxide layer 42 is then stripped and another silicon dioxide layer 51 grown in its place on the surface 36. Windows or openings 52 are then formed in the silicon dioxide layer 51 by the use of the mask shown in FIG. 4D in which the dark areas 53 represent the windows. A P-type impurity is then diffused through the windows 52 to provide a P-type region 54 which extends generally down to the collector buried layer region 32 as shown in FIG. 3F and as defined by a PN junction 56 which extends to the surface beneath the silicon dioxide layer 51. This base region 54 has a resistivity of approximately 500 ohms per square. Thereafter, the silicon dioxide layer 51 can be removed and another silicon dioxide layer 57 put in its place on the surface 36.

A plurality of openings 58 are then formed in the layer 57 by conventional photolithographic techniques utilizing the mask shown in FIG. 4E in which the dark areas 59 represent the areas uncovered by the openings 58. A P-type impurity is then diffused through the openings 58 to provide contact pads 61 for the base regions 54 and resistors 62. The resistors 62 are defined by PN junctions 63. The regions 64 and 62 have a resistivity of approximately 60 ohms per square. From FIG. 4E, it can be seen that the resistors 64 which are formed are positioned in the macro so that one end of each of the resistors is near the center of the macro region where all the intraconnections of the macro will be accomplished as hereinafter described. The other end of each of the resistors is positioned so that it is adjacent the periphery of the macro where the power supply conductor will run as hereinafter described so that these ends of the resistors can be picked up without the use of additional conductors or wiring. Also, as can be seen from FIG. 4E, the resistors are laid out so that they are symmetrical with respect to a centerline passing through the macro so that the pattern can be flipped over from one orientation to the other to simplify interconnection of the macros. It should be appreciated that in the intra-connection pattern in many cases the base of the transistor is connected to a resistor thus making possible the interconnection of the base and the resistor during the same diffusion operation.

The layer 57 can then be stripped and another silicon dioxide layer 66 grown in its place on the surface 36. Windows 67 are then formed in the layer 66 by the use of conventional photolithographic techniques utilizing a mask of the type shown in FIG. 4F in which the dark areas 68 represent the areas of the surface 36 exposed by the windows 67. An N-type impurity is then diffused through the openings 67 to form N-type regions 69 defined by PN junctions 71 which extend to the surface 36 and N+ contact regions 70 which make contact to the N+ regions 41. The openings 67 for the emitters have a very small mechanical dimension as, for example, 0.15 mils by 0.5 mils. Contact to the emitter regions 69 is made by what is conventionally called the washed emitter process. By this process any thin oxide layer which grows in the openings 67 is removed by an etch so that the same openings can be utilized for making the emitter contacts. The washed emitter process is used in fabricating the LSI chip because it saves several steps and also because it saves area.

In order to enhance the yield of satisfactory LSI chips from the wafer, it is preferable to utilize an emitter protect step to substantially eliminate the possibility of pin holes in the photoresist permitting other emitters to be formed because of the fact that the emitters utilized are so small. This can be accomplished by utilizing a mask of the type shown in FIG. 4G which has dark areas 72 that are arranged in the same pattern as the dark areas 68 in the masks shown in FIG. 4F with the exception that they are somewhat larger. Thus, a layer of photoresist is laid down on the surface of the silicon dioxide layer 66. This photoresist layer is exposed and developed to provide openings in the photoresist corresponding to the dark areas 72. Thereafter, another layer of photoresist is placed over the layer which is already on the silicon dioxide layer 66. This second layer of photoresist is then exposed through the mask which is shown in FIG. 4F. The photoresist is then developed and the undesired portions removed to provide openings or windows 67 corresponding to the dark areas 68 which correspond exactly to the size of the desired emitters. Thus, it can be seen that the emitter openings in the photoresist will only be formed where both dark areas 68 and 72 coincide. Thereafter, a suitable etch is utilized to form the openings 67. Utilization of the two layers of photoresist greatly reduces the possibility that there will be coincident pin holes in both layers which would expose the silicon dioxide layer. It is very unlikely that a pin hole in both layers of photoresist would occur in the same place. Additional openings 74 are then formed in the silicon dioxide layer 66 by the utilization of the mask shown in FIG. 4H in which the dark areas 76 correspond to the areas which are exposed through the silicon dioxide layer 66. This can be identified as a pre-ohmic step.

If desired, a pre-ohmic protect step can be provided which is very similar to the emitter protect step hereinbefore described. For such a purpose, a mask of the type shown in FIG. 4I would be utilized in which the dark areas 77 as shown thereon are positioned in generally the same positions as the dark areas 76 with the exception that they are substantially larger in size. Two layers of photoresist would again be utilized to minimize the possibility of the occurrence of pin holes.

The mask shown in FIG. 4J merely shows the minimum amount of metal from the first layer of metallization hereinafter described which is required to make contact to the devices in each macro.

Figures 3J, 3K, 3L:
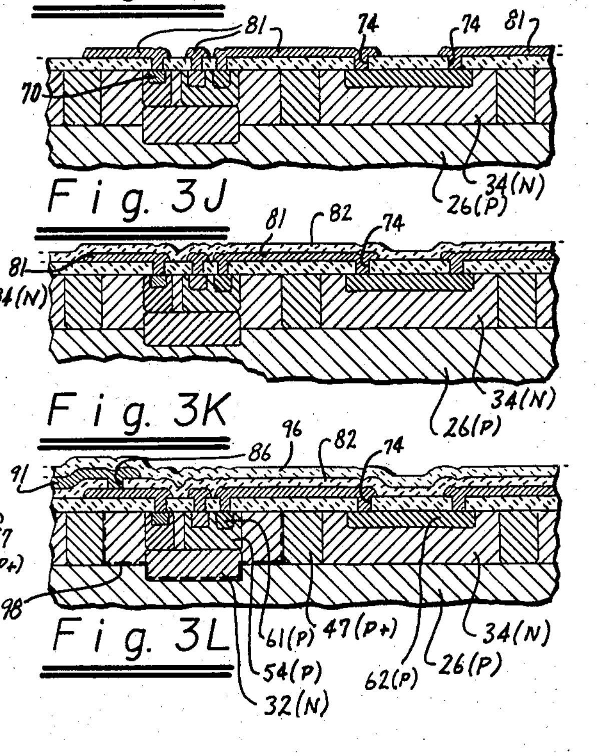

A layer of a suitable metal such as aluminum is then evaporated over the entire surface of the silicon dioxide layer 66 and into the openings or windows 67 and 74 as shown in FIG. 3J. Thereafter, by the use of conventional photolithographic techniques and by the utilization of the mask shown in FIG. 7, the undesired metal is removed so that there only remains metal which corresponds to the dark areas shown in FIG. 7. The specific interconnections which are formed will hereinafter be described in greater detail.

Figure 7:
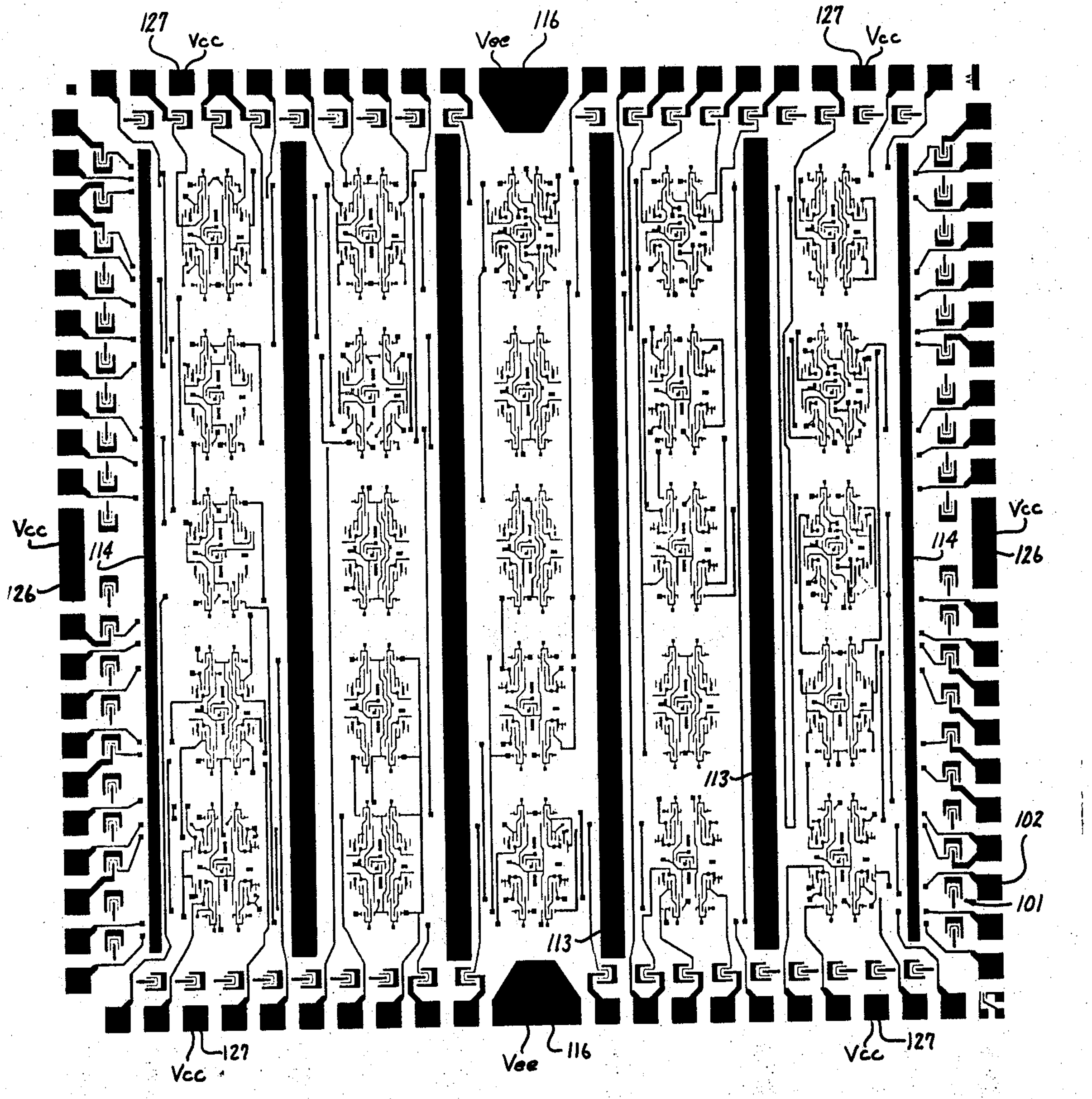
FIG. 7 is a mask for the first layer of metallization.

As soon as the pattern of metal has been formed in accordance with the pattern shown in FIG. 7, the entire surface of the semiconductor body is covered with a layer of insulating material in the form of a glass 82 of a suitable type.

Figure 8:
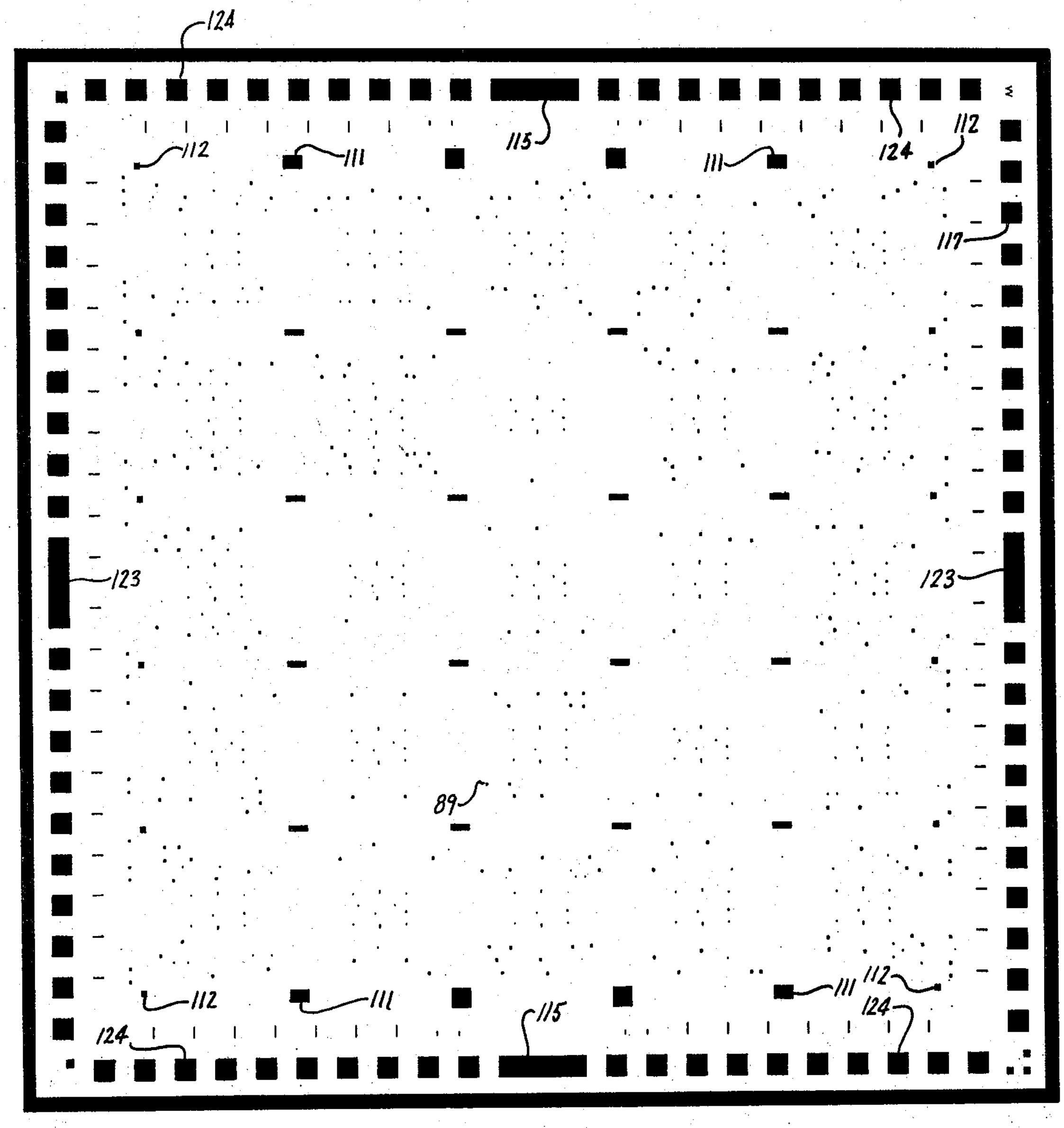
FIG. 8 is a plan view of a mask for the via holes.

After the glass layer 82 has been formed, "via" holes 86 are formed in the glass layer by the use of the mask as shown in FIG. 8 in which the dark areas 87 correspond to the via holes. By way of example, certain of the via holes have a size of 0.3 mil by 0.3 mil.

Figure 9:
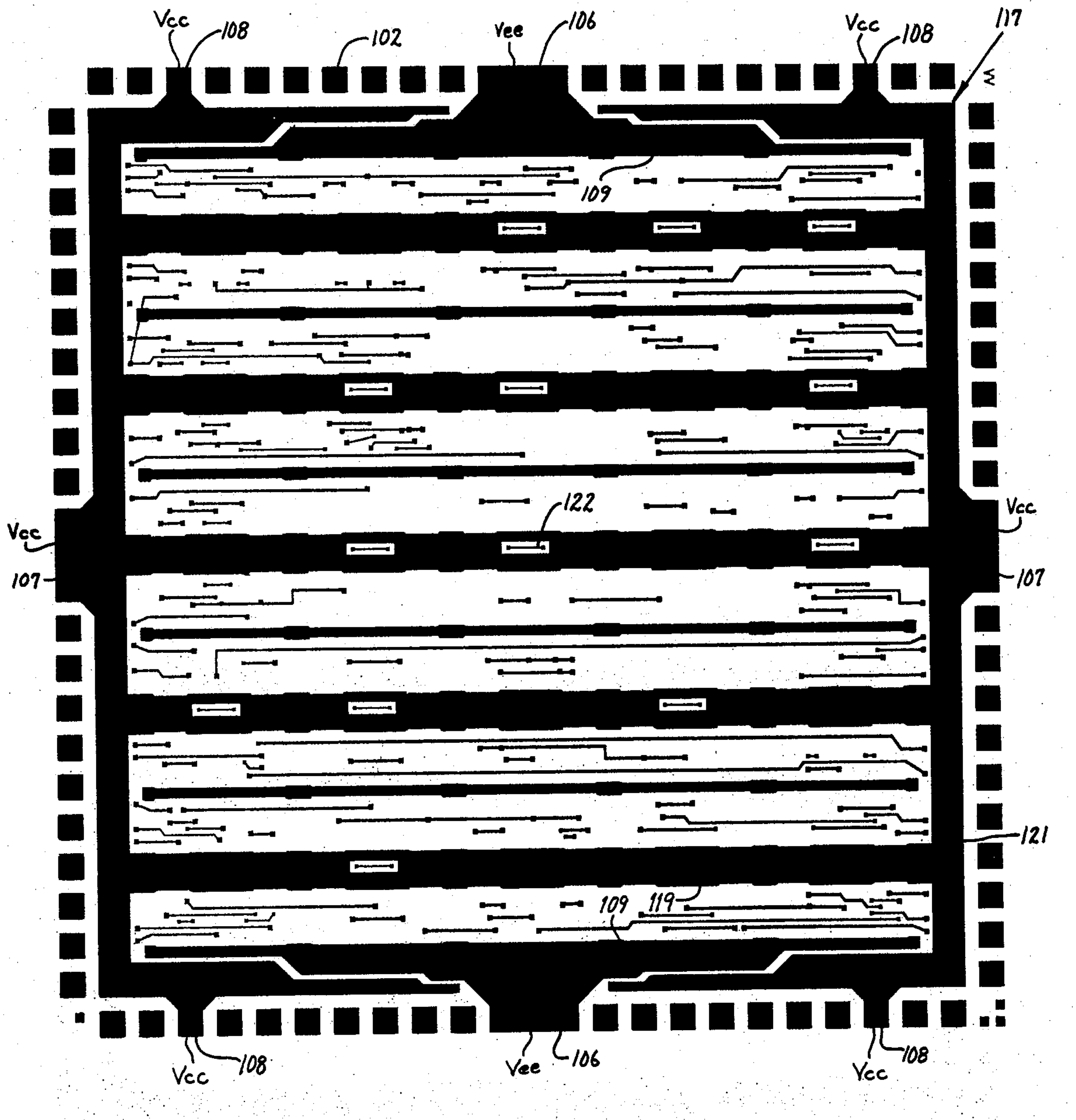
FIG. 9 is a plan view of a mask for the second layer of metallization for the LSI chip.

Thereafter, a second layer of a suitable metal such as aluminum is evaporated onto the surface of the glass 82 and into the via holes 86 to make contact with the first layer of metal 81 therebelow. The undesired metal is then removed by the use of conventional photolithographic techniques with the mask shown in FIG. 9 to provide the pattern shown by the dark areas in FIG. 9. As soon as the pattern for the second layer of metallization has been formed, the surface of the second metallization layer 91 can be covered with a layer of glass 96 as shown in FIG. 3L. This generally completes the processing steps for the fabrication of the LSI chip.

As is conventional in making integrated circuits, the chips would be probed to determine which chips met the design parameters for the chips. Thereafter, the wafer would be scribed and broken and the good chips sorted therefrom. The chips are then ready for mounting in the package 22 as hereinbefore described.

The LSI chip has been designed so that it contains a total of 627 transistors and 575 resistors which can be interconnected to form up to 100 current switch emitter follower circuits. Thirteen masks are required to produce the chip. Two metal masks and one via mask must be produced for each chip type but all chip types use the same diffusion masks.

The 627 transistors which are provided on each LSI chip include 550 small devices for current switches and internal emitter-followers as hereinafter described. A plurality of larger transistors 101 are provided near the outer perimeter of the chip adjacent all four sides of the rectangular chip. Each of these larger devices or transistors 101 is located very near to input-output pads 102 hereinafter called I/O pads formed by the first and second metallizations 81 and 91. As can be seen from FIGS. 6, 7 and 8, the I/O pads are arranged on all four sides of the chip very near the outer perimeter of the same and used for making connections to the outside world.

As described in copending application Ser. No. 270,448, filed July 10, 1972, the chip is mounted in a package 22 described therein and as shown in FIGS. 1 and 2. The chip 21 is positioned in the center of the package and is bonded to the package as described in said copending application. The package is provided with 84 leads 103 with 21 on each side of the package. These leads 103 are connected by bonding wires 104 of a suitable material such as gold to the I/O pads 102 and to voltage pads 106 and ground pads 107. As can be seen from FIG. 7, there are two large voltage pads 106 which have been identified as $V_{ee}$ and 2 large ground pads 107 and 4 small ground pads 108 which have been identified as $V_{cc}$.

From FIG. 1, it will be noted that only one of the wires 104 is provided for connecting a lead to one of the smaller pads, whereas a plurality of wires, such as three wires, are utilized for connecting each of the large leads to each of the larger pads to provide greater current carrying capabilities. As described in said copending application, the leads 103 make contact with a metallized screen pattern provided as a part of the package by brazing the leads to the screen pattern. This metallized screen pattern is an inherent part of the connection to the chip and is of relatively high resistance which provides certain desired characteristics for the chip as hereinafter described.

The voltage pads 106 are connected to a suitable source of voltage such as a −5 volts. The voltage pads 106 are formed as part of vertical second layer metallization buses 109 (see FIG. 9) on opposite sides of the chip. The voltage buses 109 are connected through large via holes formed by areas 111 and small via holes formed by areas 112 of the mask in FIG. 8 to four large horizontal buses 113 and two small horizontal buses 114 provided in the first layer metallization (see FIG. 7). As can be seen from FIG. 7, these buses are equally spaced across the chip with the two smaller buses 114 being on opposite sides of the chip and the other four larger voltage buses being spaced equally between the two smaller buses. Large via holes made by areas 115 on the mask in FIG. 8 provide connection to pads 116 on the first layer of metallization.

The ground connection for the chip is brought in through the ground pads 107 to a ground distribution bus system 117 which consists of a plurality of vertically extending buses 119 which are spaced across the chip and which run vertically through the center of each macro. The vertically extending ground buses 119 are interconnected by horizontally extending ground buses 121. Openings 122 are provided in the second layer metallization in the vertical ground buses 119 to provide interconnections within the macros. The ground system 117 is connected through large ground via holes formed by areas 123 and small ground via holes formed by areas 124 (see FIG. 8) to large pads 126 and small pads 127 provided in the first layer metallization.

The voltage buses have been provided on the first layer metallization and the ground buses on the second layer metallization in order to obtain a lower voltage drop on the ground bus system. This lower voltage drop on the ground bus system is obtained primarily because the second layer metallization is substantially thicker than the first layer metallization. By way of example, the first layer metallization can have a thickness of approximately 6,500 to 8,000 Angstroms, whereas the second layer metallization can have a thickness of approximately 10,000 to 15,000 Angstroms or, in other words, a ratio of approximately 1:2. With such parameters, the first layer metallization has a sheet resistance of approximately 45 milliohms per square, whereas the second layer metallization has a sheet resistance of approximately 22 milliohms per square. The first layer metallization has a maximum current carrying capability of approximately 16 milliamperes per mil, whereas the second layer metallization has a maximum current carrying capability of approximately 24 milliamperes per mil.

The chip has been designed to have the first metal lines on the first layer metallization on 0.70 mil centers and with the second metal lines on the second layer metallization on 0.95 mil centers. A via hole extending through the glass layer 82 can be placed at any intersection of the first and second metal lines, thus giving a 0.70 × 0.95 mil grid. It is not permissible to utilize two adjacent vias because a minimum of 0.4 mil clearance must be provided. However, diagonally adjacent vias can be utilized if the corners of the second metal pads are cut to maintain the required minimum clearance. With such a geometry, the minimum via size has been designed as being 0.3×0.3 mils. The first layer of metal underlap is 0.15 mils and the second layer of metal overlap is 0.2 mils.

In the present design, there are 25 macros provided on each chip with each macro extending over an area of 24 mils × 24 mils. Each macro contains one bias driver and enough devices to make either 2, 3 or 4 current switch emitter followers. The devices are arranged in four mirror image quadrants around the bias driver. Each macro has 24 fixed positions where its I/O may be connected by the inter-macro wiring. A maximum of 13 may be used on any given macro in order to limit the channel wiring requirements. This is a convenient number because most dual in-line packages presently in use having small scale chips have 14 leads.

Figure 13:
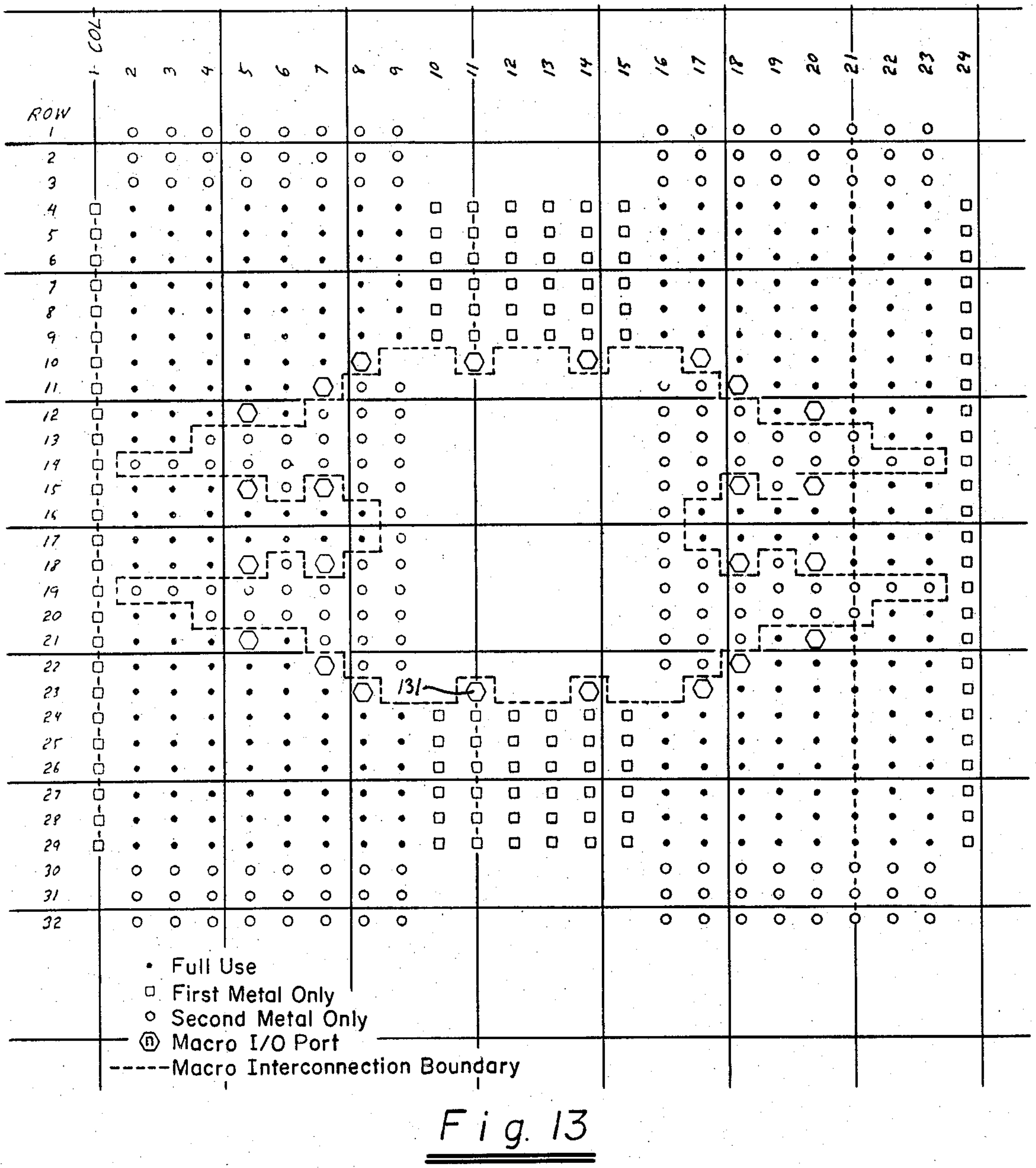
FIG. 13 is an enlarged plan view of the macro and showing I/O ports.

FIG. 13 shows the location of the 24 I/O ports 131 which have been so designated. As can be seen from FIG. 13, the macro interconnection grid is shown with the type of metal that can be used at each grid point in the grid of the macro. Each of the macros can be placed in any one of the 25 possible macro positions on the chip. In order to simplify the chip wiring, all macros have the ability to flip about the Y-axis.

Figure 6:
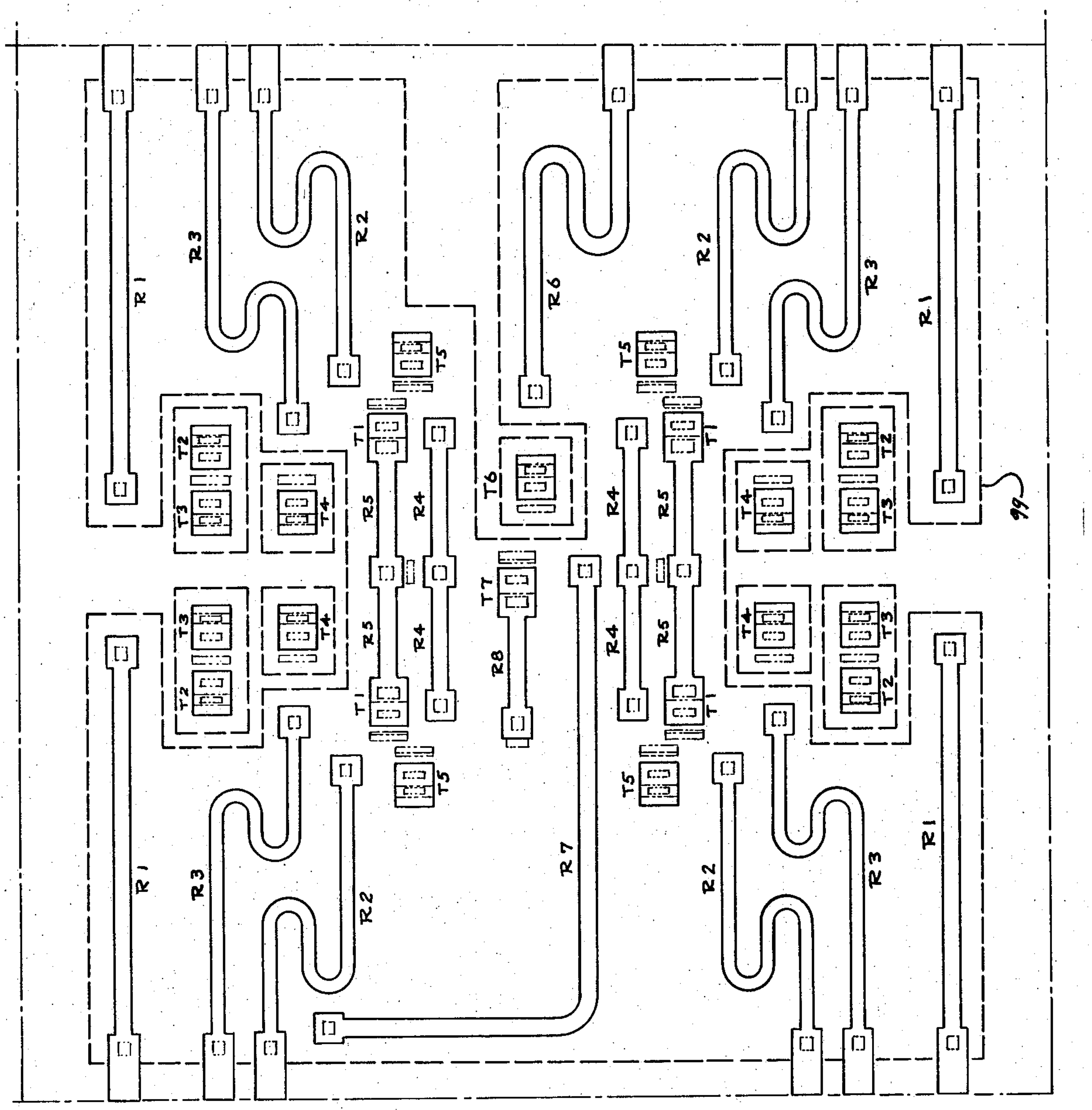
FIG. 6 is a greatly enlarged view of the transistors and resistors in one of the macros.

In FIG. 6, there is shwon the diffusion pattern for one macro. The diffusion operations shown forming the pattern shown in FIG. 6 have hereinbefore been described All of the resistors are made from the 60 ohm per square base diffusion. As can be seen from FIG. 6, the resistors are in the shape of a dog-bone, i.e., they are elongate with enlarged ends with certain of the resistors having an S-bend intermediate the ends in order to cut down the area over which the resistors extend. Certain of the resistors which connect directly to the devices have straight ends. In the present design, the minimum resistor width is 0.3 mil for resistors with a loose tolerance. A minimum of 0.4 mil width is used for tighter tolerance resistors or resistors that must track others in value. The minimum pad contact opening is 0.3 mils square.

Figures 10, 11, 12:
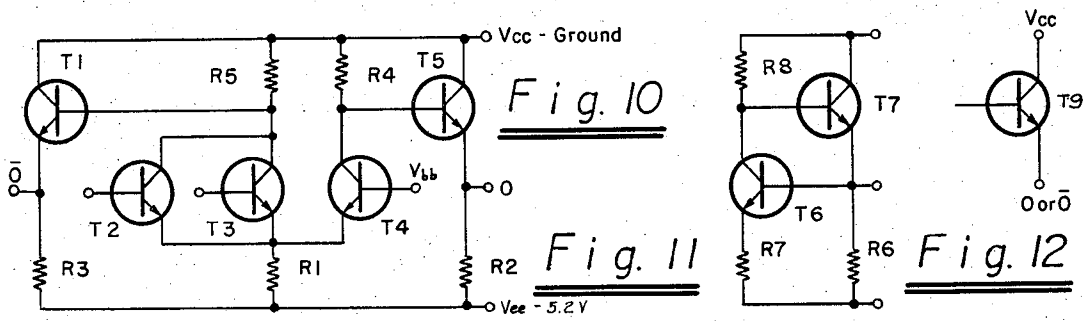
FIGS. 10, 11 and 12 are circuit diagrams of the components of the chip.

In FIG. 10, there is shown a circuit diagram of the internal circuitry which is utilized in each macro. Four of the circuits shown in FIG. 10 are provided and each consists of resistors R1 –R5 and transistors T1 –T5 which also have been identified in FIG. 6. As explained previously, four of the circuits of the type shown in FIG. 10 are provided around each bias driver in which one is provided for each macro. The circuit diagram for the bias driver is shown in FIG. 11 and consists of resistors R6, R7 and R8 and transistors T6 and T7 which also have been identified in FIG. 6.

The logic circuit which is shown in FIG. 10 is a current switch emitter-follower which operates in a conventional manner. It operates with a –5.2 volt ($V_{ee}$) power supply. A –1.3 volt ($V_{bb}$) is generated by a bias driver circuit in each macro.

If a current switch emitter-follower has all its loads on the same chip, a small transistor and a 2 k pull-down resistor located within the macro are used ad the emitter-follower (internal EF). When a current switch emitter-follower drives loads not on the chip, a larger transistor near the I/O pad is used as the emitter-follower (external EF). A circuit diagram for the external emitter-follower transistor is shown in FIG. 12 which operates in the same manner as internal current switch. Each external emitter-follower will drive a transmission line terminated in 100 ohms to –2.0 volts. If an internal emitter-follower is driving a large load, two pull-down resistors may be used to speed up turn-off.

With circuitry designed in this manner, it has been found that the nominal power dissipation for a current switch is 20 millowatts, for an internal emitter-follower is 10 millowatts, for an external emitter-follower it is 10 millowatts, and for the bias circuit it is 21.5 millowatts.

In connection with each of the macros, all unused devices are tied to $V_{ee}$ or ground in a manner that does not dissipate power or cause leakage paths. The current switch emitter-resistors and the emitter-follower pull-down resistors are always connected to the $V_{ee}$ power bus. All collector resistors and transistor collectors are tied to ground. If an I/O port of a macro is not used, the base inputs are shorted to the emitter and the emitter-follower emitters are left open.

In the combination resistor-transistors which are provided in each of the macros, the out-of-phase internal emitter-follower transistor T1 and the base biasing resistor R5 are in the same junction isolation region. The N-type silicon is connected to ground for the emitter-follower collector to keep the resistor junction reverse biased. The base contact for the transistor and the resistor are both made from the same diffusion. Since they are always electrically tied together, the resistor and the base are joined during diffusion to save space and to eliminate one pre-ohmic opening.

Four sizes of transistors are utilized in the LSI chip. The smallest device is used in the current switch within the macro. A dual current switch transistor with a common collector is used for current switch inputs and is represented by the transistors T2 and T3. A third small device, used for internal emitter-followers such as transistor T5, is the same as the current switch device except for a 50 microinch larger spacing from the collector opening to the emitter. A large transistor with two base contacts such as transistor T9 is used as an external emitter-follower. The external emitter-followers are located near the I/O pad in order to cut down the output lead resistance. When used, each emitter of each transistor can be connected to one of the two adjacent pads. Therefore, one pad can be connected to a maximum of two emitter-followers. These external emitter-follower transistors have approximately five times the current carrying capacity of the smaller transistors. These larger transistors have been positioned around the outer perimeter of the chip in order to minimize any series resistance between these external emitter-follower transistors and the outside world. Thus, they have been placed very close to the I/O pads so that the total run from the emitter of the external emitter-follower to the I/O pad is not over 2 or 3 mils.

By having the first level metallization having conductors running essentially in a horizontal direction and with the second level metallization having conductors running generally in a vertical direction makes it easy to utilize computer design for designing the internal wiring for the macros and the wiring for interconnecting the macros. The metallization if formed so that each macro has 12 first metal and 16 second metal wiring channels. It will be noted that for each of the macros, the intra-macro wiring is very tightly constrained in the center of the macro so as to maximize the space which can be utilized for inter-macro wiring. In examining the chip, it can be seen that approximately 50 percent of the space on the chip can be utilized for inter-macro wiring.

From the foregoing, it can be seen that there has been provided an LSI chip construction and method which has many advantages. The large emitter-follower transistors are provided on the periphery of the chip. Open wire channels are utilized for eacy computer aided design placement of intramacro wires with tight manual placement of intra-macro wires. This has been facilitated by the fact that there are limited positions and numbers of I/O ports. Each macro corresponds to a small integration level chip and for that reason the limited number of 13 I/O ports corresponds to the number of leads utilized in conventional dual in-line packages used in small scale integration. Various transistor sizes have been provided depending upon the function of the transistor. Thus, the large transistors serve as emitter-followers for driving transmission lines with high power, whereas the small transistors are formed so that they have high speed and stability, high series resistance ($R_{bb}$) and low collector capacitance ($C_{cc}$). This makes for a very stable device with only a very slight compromise in the speed of all transistors.

Emitter coupled logic has been utilized for the current switching circuits because it is fast, simple and stable. It is also possible to make such switching circuits with a minimum number of components. It also provides the best speed for the power dissipation. Thus, it can be seen that the emitter coupled logic which is utilized is very versatile and is particularly adaptable to the LSI chip construction herein provided. A simple voltage reference generating circuit is provided. In order to minimize power supply connections to the chip, only one power supply is brought in, a −5.2 volts. The reference voltage which is required by the circuitry utilized is generated internally by a voltage generation circuit on each macro. This reference generating circuit as hereinbefore described is in the form of two transistors and three resistors which are used to provide a voltge dropping circuit to obtain a semi-regulating −1.3 volt supply for the reference voltage.

With respect to the power distribution on the chip, the ratio of I/O pads of ground to $V_{ee}$ is between 3:1 and 4:1 in order to preserve 3:1 to 4:1 ratio of resistance and inductance for the $V_{ee}$ and ground distribution systems. The power bus is provided on two layers. The entire power distribution system is relatively simple even though it is provided on two layers by virtue of its orthogonality. The semiconductor body of the LSI chip is not used for power distribution.

During operation of the chip, there will be power dissipation from the devices which will have a tendency to increase the temperature of the chip. As the temperature increases, the emitter-follower diode characteristic pulls in, that is, the output signal levels shift positively. If the chip is dissipating power, then it follows high currents are being drawn from the power supply. The power current supply comes from ground. If there is resistance in the ground connection to the chip, that current through that resistance will give a voltage shift which is a negative voltage shift. By careful design of the chip, the voltage drop (due to resistance and inductance in the conductors) on the ground distribution system "tracks" with the voltage drop on the $V_{ee}$ distribution system. In addition, the ground shift in voltage is made to "track" with chip temperature. Thus, with a careful design of the chip in conjunction with the package, the shift due to temperature and the shift due to resistance in the ground can be balanced out. This is obtained as hereinbefore described by the use of a screen pattern connected to ground which is of relatively high resistance.

It has been found that with the present LSI chip construction, additional power supply decoupling is obtained from built-in capacitance which is derived principally from two sources. One is the collector to substrate PN junctions of the emitter-followers provided in the chip. In the event there are certain emitter-followers of the LSI chip which are not utilized in certain logic, the $V_{cc}$ terminals of such emitter-followers are connected to ground in order to enhance the value of the decoupling capacitance. This junction providing the decoupling capacitance is represented by the dark broken line 98 shown in FIG. 3L. Another principal source of decoupling capacitance is provided by the PN junctions forming the isolation pockets for the resistors. These isolation pockets cover relatively large areas. For example, a typical isolation pocket is that area which is enclosed by the broken line 99 shown in FIG. 6. As shown in FIG. 6, this large area is devoted to resistors.

This built-in power supply decoupling capacitance is important because it prevents high frequency deviations on the power supply used in the chip.

It is apparent from the foregoing that there has been provided a new and improved LSI chip construction and method which has many advantages. It is possible to obtain very high performance. Time delay in the circuits and the chip is better than 2 nanoseconds. Although a large number of logic circuits can be provided utilizing different interconnection patterns, only a single set of common diffusion masks is required. The arrangement of the devices on the LSI chip is such as to maximize utilization of the space on the chip while providing adequate space for intra and inter-chip wiring. The construction of the chip is such that there is a built-in power supply decoupling capacitance. In addition, the ground shift in voltage tracks with chip temperature. Thus, shifts due to temperature changes and resistance changes in the ground can be balanced out.

We claim:

1. In an LSI chip construction, a single semiconductor body having a planar surface, a plurality of transistors formed in the semiconductor body and having regions which extend to the surface, the transistors being formed in a predetermined pattern on the body, a plurality of resistors formed in the semiconductor body in a predetermined pattern and also having contact areas extending to the surface, means overlying the surface including at least one layer of metallization having input and output pads adjacent the perimeter of the body and connected to the transistors and resistors to form a plurality of circuits which are clustered into groups to provide a plurality of macros which form an array, with each macro being capable of containing a plurality of logic circuits, each of said macros being confined to a discrete area on said planar surface, said discrete areas having said macros therein being spaced apart and arranged on said planar surface to provide spaced parallel rows and spaced parallel columns of macros extending in two directions which are at an angle with respect to each other and to provide interconnect areas on said planar surface extending between said discrete areas containing said macros and alongside said rows and columns, said metallization including metallization which overlies said interconnect areas for interconnecting said macros.

2. A construction as in claim 1 wherein certain of the transistors are larger transistors in close proximity to the output pads.

3. A construction as in claim 1 wherein the transistors are connected into current switch emitter-follower circuits.

4. A construction as in claim 1 wherein the transistors utilized in the macros have high speed and stability.

5. A construction as in claim 1 wherein said means overlying the surface including at least one layer of metallization comprises a power bus system and a ground bus system.

6. A construction as in claim 5 wherein said power bus system is formed on first and second levels and said ground bus system lies on one of the same levels as said power bus system.

7. A construction as in claim 6 wherein the metallization forming the ground bus system has a thickness which is substantially greater than that of the power bus.

8. A construction as in claim 6 wherein the ground bus system and the power bus system extend generally orthogonally with respect to each other.

9. A construction as in claim 6 together with a layer of insulating material separating the first and second levels and having vias extending therethrough forming interconnections between the first and second levels.

10. A construction as in claim 1 wherein each of the macros is adapted to be flipped about an axis to provide a different orientation to facilitate the interconnection between macros.

11. A construction as in claim 1 wherein transistors having washed emitters with relatively small geometries are utilized.

12. A construction as in claim 1 in which the resistors in each macro are positioned with one end of each of the resistors near the outer perimeter of the macro.

13. A construction as in claim 12 in which the resistors are positioned so that one end of each of the resistors is near the center of the macro region and wherein the interconnections of the macro are completed near the center.

14. A construction as in claim 13 in which the resistors are laid out symmetrically around a centerline extending through the macro so that the macro can be reversed to simplify interconnection procedures between macros.

15. A construction as in claim 1 in which certain transistors and resistors in the macro are merged to form a common device.

16. A construction as in claim 1 which facilitates computer aided design placement of intra-macro conductors.

17. A construction as in claim 1 in which two input pads are provided adjacent the perimeter of the semiconductor body for receiving power and in which the power is distributed on the power buses from the two input pads.

18. A construction as in claim 1 wherein a plurality of ground pads are provided adjacent the perimeter of the semiconductor body.

19. A construction as in claim 5 in which the voltage drop due to resistance and inductance in the ground bus system generally tracks the voltage drop on the power bus system.

20. A construction as in claim 19 in which the shift in voltage drop on the ground bus system tracks with the temperature of the semiconductor body.

21. A construction as in claim 19 wherein the ground system includes a high series resistance.

22. A construction as in claim 1 wherein each macro has a limited number of input/output ports to simplify the inter-macro connections.

23. A construction as in claim 1 wherein different logic circuits can be formed by utilizing different layers of metallization for the chips having different logic circuits and a common diffusion pattern.

24. In an LSI chip construction, a semi-conductor body having a planar surface, means forming isolated regions in the semiconductor body, a plurality of transistors formed in the semiconductor body and having collector, base and emitter regions defined by PN junctions which extend to the surface, a plurality of resistors formed in the semiconductor body in a predetermined pattern in an isolated region and also having contact areas extending to the surface and means provided on the surface and including two layers of metallization providing a voltage distribution system and a ground distribution system and being coupled to the transistors and resistors, said two layers of metallization being formed so that the voltage drop on the ground distribution system substantially tracks with the voltage drop on the voltage distribution system.

25. A construction as in claim 24 wherein the chip is constructed so that the shift in voltage drop on the ground distribution system generally corresponds with the temperature of the semiconductor body.

26. A construction as in claim 24 wherein a built-in decoupling capacitance is provided.

27. A construction as in claim 26 wherein said decoupling capacitance is formed by the collector to semiconductor body junctions of at least certain of the transistors.

28. A construction as in claim 27 wherein said isolated regions are formed by PN junctions and wherein said decoupling capacitance is also formed by the PN junctions defining the isolated regions.

29. A construction as in claim 3 wherein certain of the current switch emitter-follower circuits are made of larger transistors located near the perimeter of the semiconductor body and near the input/output pads and in which others of the transistors are formed into current switch emitter-follower circuits that are included in the groups to provide the plurality of macros.

* * * * *